(12) United States Patent
Huang

(10) Patent No.: US 8,482,992 B2
(45) Date of Patent: Jul. 9, 2013

(54) METHOD OF CONTROLLING OPERATIONS OF A DELAY LOCKED LOOP OF A DYNAMIC RANDOM ACCESS MEMORY

(75) Inventor: Ming-Chien Huang, New Taipei (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 202 days.

(21) Appl. No.: 13/192,468

(22) Filed: Jul. 28, 2011

(65) Prior Publication Data

US 2013/0028029 A1    Jan. 31, 2013

(51) Int. Cl.
*G11C 7/00* (2006.01)
*G11C 8/00* (2006.01)

(52) U.S. Cl.
USPC ... 365/189.07; 365/149; 365/194; 365/230.1; 365/130.12

(58) Field of Classification Search
USPC .......................... 365/233.12, 233.15
See application file for complete search history.

(56) References Cited

U.S. PATENT DOCUMENTS

| | | | |
|---|---|---|---|
| 6,456,130 B1 | 9/2002 | Schnell | |
| 6,556,489 B2 * | 4/2003 | Gomm et al. | 365/194 |
| 6,707,759 B2 * | 3/2004 | Song | 365/189.15 |
| 7,218,568 B2 | 5/2007 | Smith et al. | |
| 7,277,333 B2 * | 10/2007 | Schaefer | 365/194 |
| 7,277,357 B1 * | 10/2007 | Ma et al. | 365/233.12 |
| 7,728,638 B2 | 6/2010 | Varricchione | |
| 7,729,197 B2 * | 6/2010 | Bell et al. | 365/233.12 |
| 8,358,547 B2 * | 1/2013 | Choi | 365/194 |

* cited by examiner

*Primary Examiner* — Tan T. Nguyen
(74) *Attorney, Agent, or Firm* — Jianq Chyun IP Office

(57) ABSTRACT

A method for controlling operations of a delay locked loop (DLL) of a dynamic random access memory (DRAM) is provided herein. A phase detector of the DLL compares an external clock signal with a feedback clock signal to generate a first control signal. A delay line circuit of the DLL delays the external clock signal according to the first control signal. A detector of the DRAM detects variations of the first control signal to determine a length of an enable period of an enable signal. The delay line circuit and the output buffer are active only during the enable period when the DRAM is in a standby mode.

8 Claims, 7 Drawing Sheets

METHOD OF CONTROLLING OPERATIONS OF A DELAY LOCKED LOOP OF A DYNAMIC RANDOM ACCESS MEMORY

BACKGROUND OF THE INVENTION

1. Field of Invention

The present invention is related to a method of controlling operations of a dynamic random access memory (DRAM), and more specifically, to a method of controlling operations of a delay locked loop (DLL) of the DRAM.

2. Description of Related Art

Typically, an electronic system includes a number of integrated circuit chips that communicate with one another to perform system applications. Often, the electronic system includes a controller, such as a micro-processor, and one or more memory chips, such as random access memory (RAM) chips. The controller communicates with the memory to store data and to read the stored data.

Sometimes, data and strobe signals are communicated between chips, such as a controller and RAM, to read and write data. To write data from the controller to the RAM, data and a clock or strobe signal are transmitted to the RAM and the received data is clocked into the RAM via the clock signal. To read data from the RAM, output data and a strobe signal are transmitted from the RAM. The output data and strobe signal are aligned to a clock signal via a delay locked loop (DLL).

Typically, the RAM receives an external clock signal and the DLL receives the external clock signal or an on-chip clock signal based on the external clock signal. The DLL provides an internal clock signal based on the external clock signal. The internal clock signal clocks the output data and strobe signal out of the RAM via output circuitry. The internal clock signal is fed back to a phase detector via a delay that mimics the delay of the output circuitry. The DLL aligns and locks the delayed internal clock signal to the external clock signal, which aligns the output data and strobe signal to the external clock signal. Since the external clock signal may drift over time and changes in the supply voltage and temperature may cause timing changes, the DLL runs continuously to maintain a lock state, which consumes considerable current.

In standby mode, integrated circuit chips are put into a low power state. If a DLL runs continuously in standby mode, the DLL is ready to drive output data as soon as the chip comes out of standby mode, however, considerable power is consumed in standby mode. If the DLL is switched off or loses lock state in standby mode, it takes considerable time to exit standby mode because the DLL must re-acquire lock state. As speeds increase and power consumption becomes more critical, these problems are amplified.

FIG. 1 is a conventional DLL 100 of a dynamic random access memory (DRAM). Referring to FIG. 1, the DLL 100 has a phase detector 110, a delay line circuit 120, and an output buffer 130. The phase detector 110 receives an external clock signal XCLK and compares the external clock signal XCLK with a feedback clock signal CLK received from the output buffer 130. The phase detector 110 adjusts a delay of the delay line circuit 120 according to the comparison result of the external clock signal XCLK and the feedback clock signal CLK to synchronize the external clock signal XCLK with the feedback clock signal CLK. The output buffer 130 outputs the feedback clock signal CLK as an internal clock signal. The delay line circuit 120 and the output buffer 130 are active only when the voltage level of an enable signal IDDL is high.

FIG. 2 is a timing diagram of signals of the DLL 100 shown in FIG. 1. Referring to FIGS. 1 and 2, when a voltage level of a clock enable signal CKE is low, the DRAM is in a standby mode (e.g. a pre-charge power down (IDD2P) mode) to reduce the power consumption of the DRAM within a standby period Ta. Every a predetermined update interval Tb within the standby period Ta, the enable signal IDDL is pulled from a low level to a high level, such that the delay line circuit 120 and the output buffer 130 are active within the enable periods Tc periodically to maintain the lock state of the DLL 100. However, the lengths of the predetermined update interval Tb and the enable periods Tc are fixed and determined based on the periods of the external clock signal XCLK. Therefore, an extra clock counter is required to count a number of clocks of the external clock signal XCLK to determine the beginnings and the ends of the enable periods Tc accordingly. However, the clock counter increases the consumed power of the DRAM even when the DRAM is in the standby mode, and the DRAM, thus, may not operate correctly to conform to the specification of the standby mode.

SUMMARY OF THE INVENTION

Accordingly, an object of the present invention is to provide a method of controlling operations of a DLL of a DRAM. When the DRAM is in a standby mode, the enable periods of the DLL could be adjusted dynamically.

A further object of the present invention is to provide a method for controlling operations of a delay locked loop (DLL) of a dynamic random access memory (DRAM). The method has a step of providing an external clock signal to a phase detector of the DLL. The method further has a step of comparing the external clock signal with a feedback clock signal by using the phase detector. The feedback clock signal is received from an output buffer of the DLL. The method further has a step of generating a first control signal according to a result of the comparison of the external clock signal and the feedback clock signal. The method further has a step of adjusting a delay of a delay line circuit of the DLL based on the first control signal. The delay line circuit is coupled between the phase detector and the output buffer to receive and delay the external clock signal. The method further has a step of detecting variations of the first control signal to determine a length of an enable period of an enable signal. The delay line circuit and the output buffer are active only during the enable period when the DRAM is in a standby mode.

A further object of the present invention is to provide a method for controlling operations of a DLL of a DRAM. The method comprises a step of providing an external clock signal to a phase detector of the DLL. The method further comprises a step of comparing the external clock signal with a feedback clock signal by using the phase detector. The feedback clock signal is received from an output buffer of the DLL. The method further comprises a step of generating a first control signal according to a result of the comparison of the external clock signal and the feedback clock signal. The method further comprises a step of adjusting a delay of a delay line circuit of the DLL based on the first control signal. The delay line circuit is coupled between the phase detector and the output buffer to receive and delay the external clock signal. The method further comprises a step of adjusting a duty cycle of a first delayed clock signal outputted by the delay line circuit according to a second control signal to output a second delayed clock signal by using a duty cycle corrector. The method further comprises a step of detecting the duty cycle of the second delayed clock signal to generate the second control signal. The method further comprises a step of detecting variations of the first control signal or variations of the second control signal to determine a length of an enable period of an enable signal. The delay line circuit, the duty cycle corrector and the output buffer are active only during the enable period when the DRAM is in a standby mode.

In an embodiment of the present invention, the phase detector generates the first control signal based on the external clock signal. The method further comprises a step of ending the enable period of the enable signal when status of the first control signal is changed twice within two successive periods of the external clock signal.

In an embodiment of the present invention, the method further comprises a step of determining a beginning of the enable period of the enable signal according to a refresh signal of a self refresh counter of the DRAM. The self refresh counter is used to refresh data stored in the DRAM, and the refresh signal is used to trigger the DRAM to refresh the data.

In an embodiment of the present invention, the method further comprises steps of adjusting a duty cycle of a first delayed clock signal outputted by the delay line circuit according to a second control signal to output a second delayed clock signal; detecting the duty cycle of the second delayed clock signal to generate the second control signal; and detecting variations of the second control signal. The length of the enable period of the enable signal is determined based on the variations of the first control signal and the variations of the second control signal.

In an embodiment of the present invention, the first control signal and the second control signal are generated based on the external clock signal. The method further comprises a step of ending the enable period of the enable signal when status of the first control signal or the second control signal is changed twice within two successive periods of the external clock signal.

As described above, the length of the enable period of the enable signal is determined by detecting variations of the first control signal. Therefore, when the DRAM is in the standby mode, the enable periods of the DLL could be adjusted dynamically.

In order to make the aforementioned and other objects, features and advantages of the present invention comprehensible, several preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
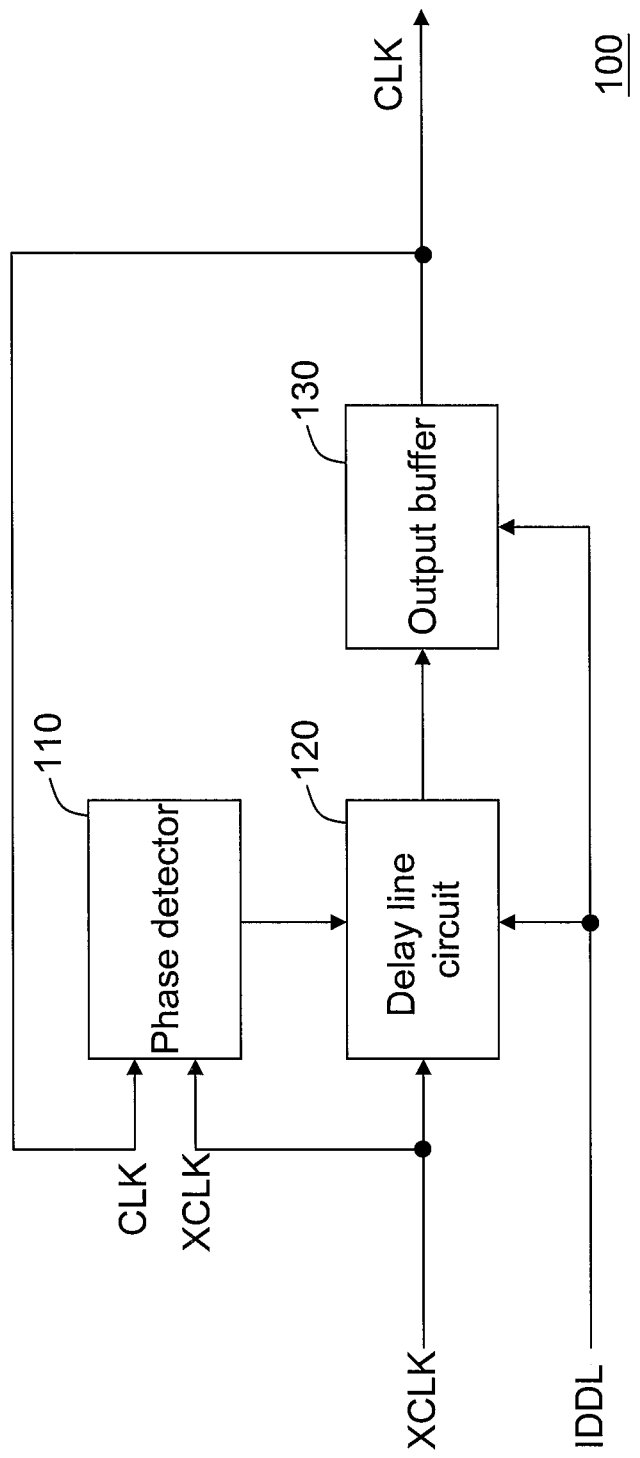
FIG. 1 is a conventional DLL of a dynamic random access memory.
Figure 2:
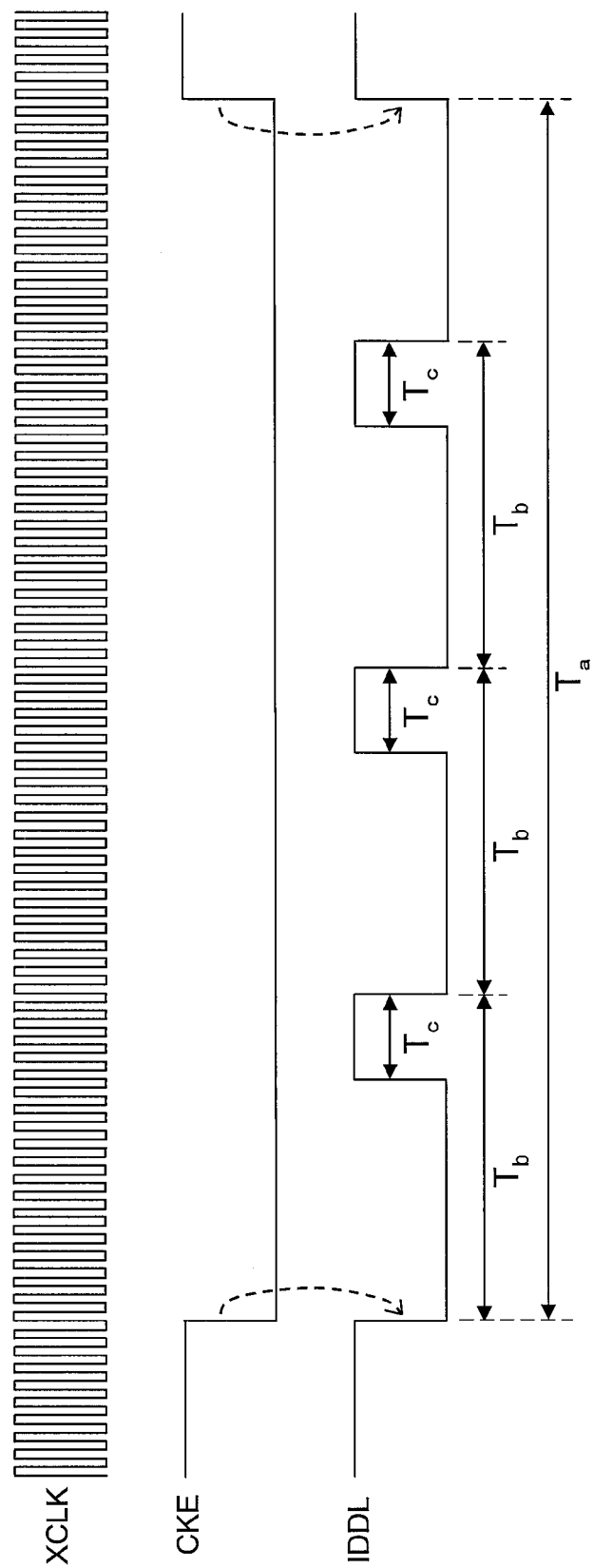
FIG. 2 is a timing diagram of signals of the DLL shown in FIG. 1.
Figure 3:
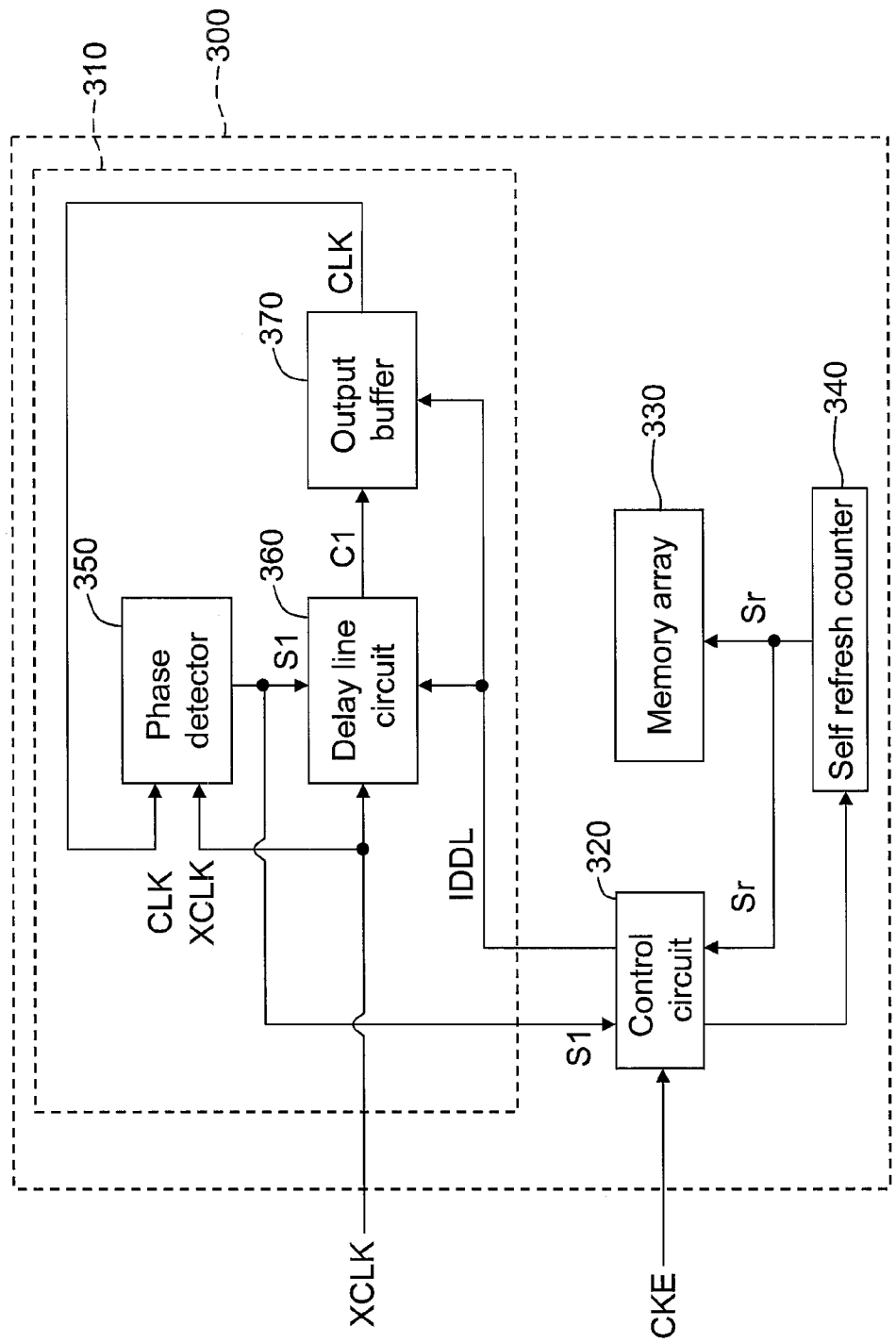
FIG. 3 is a functional block diagram of a DRAM of an embodiment of the present invention.

FIG. 3 is a functional block diagram of a dynamic random access memory (DRAM) 300 of an embodiment of the present invention. The DRAM 300 has a delay locked loop (DLL) 310, a control circuit 320, a memory array 330, and a self refresh counter 340. The DLL 310 receives an external clock signal XCLK. The control circuit 320 receives a clock enable signal CKE, a first control signal S1, and a refresh signal Sr to control the operations of the DRAM 300. The memory array 330 has a plurality of memory cells (not shown) for storing data. The self refresh counter 340 is used to refresh data stored in the memory array 330 of the DRAM 300, and the refresh signal Sr generated by the self refresh counter 340 is used to trigger the DRAM 300 to refresh the stored data of the memory array 330.

The DLL 310 is used to align and lock the internal clock signal CLK to the external clock signal XCLK. The DLL 310 has a phase detector 350, a delay line circuit 360, and an output buffer 370. The external clock signal XCLK is provided to the phase detector 350, and the phase detector 350 compares the external clock signal XCLK with the internal clock signal CLK, which is feedback from the output buffer 370. The phase detector 350 generates the first control signal S1 according to a result of the comparison of the external clock signal XCLK and the feedback clock signal CLK. The delay line circuit 360 is coupled between the phase detector 350 and the output buffer 370 to receive and delay the external clock signal XCLK according to the first control signal S1 so as to output a first delayed clock signal C1. Accordingly, a delay of the delay line circuit 360 of the DLL 310 is adjusted based on the first control signal S1. Moreover, the control circuit 320 detects the variations of the first control signal S1 to determine a length of an enable period of an enable signal IDDL. Accordingly, the length of the enable period could be adjusted dynamically.

Figure 4:
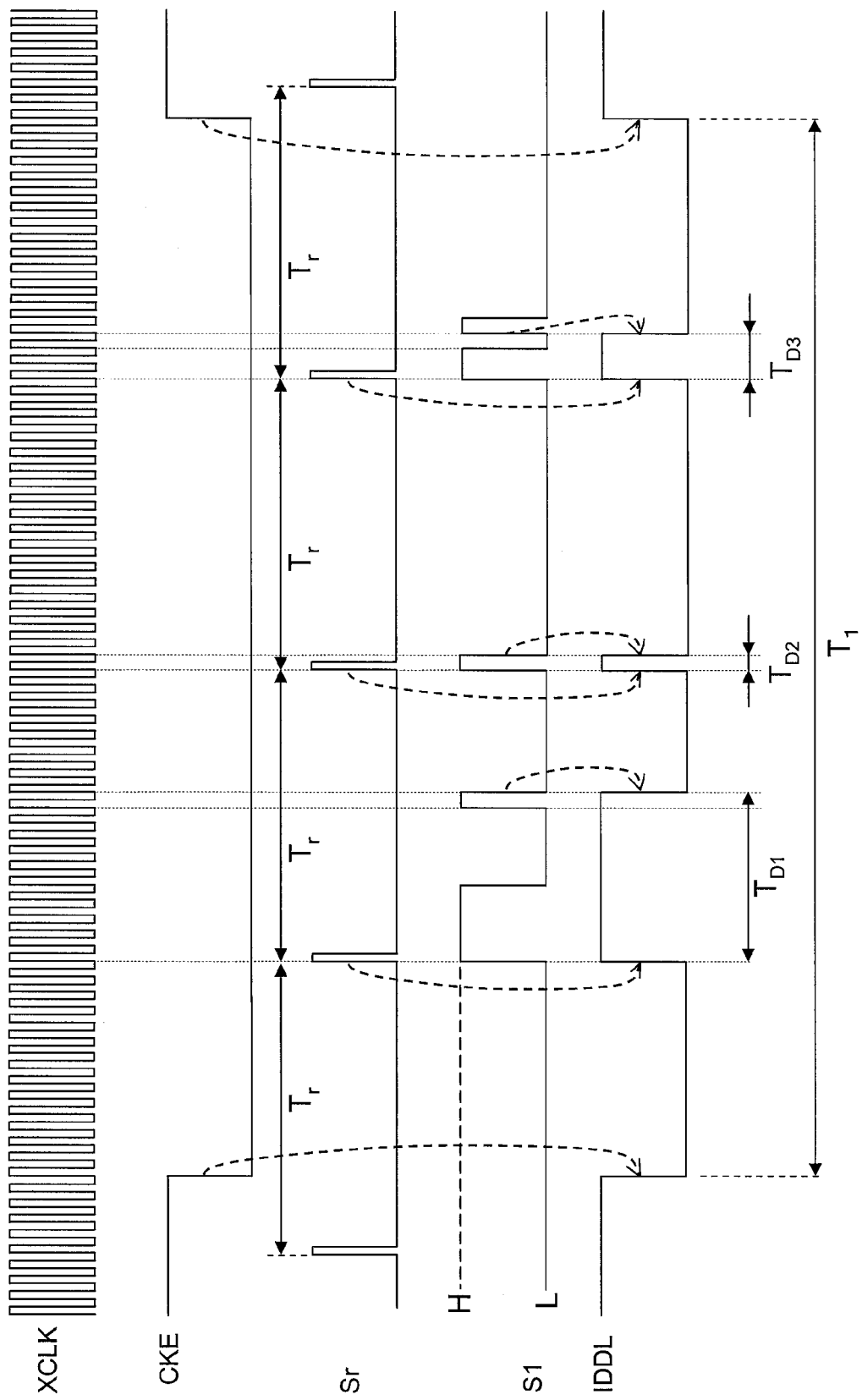
FIG. 4 is a timing diagram of signals of the DRAM shown in FIG. 3.

FIG. 4 is a timing diagram of signals of the DRAM 300 shown in FIG. 3. Referring to FIGS. 3 and 4, when the voltage level of the clock enable signal CKE is low, the DRAM 300 is in the standby mode (e.g. the IDD2P mode) to reduce the power consumption of the DRAM 300 within a standby period $T_1$. When the DRAM 300 is in the standby mode, the delay line circuit 360 and the output buffer 370 are active only during the enable periods $T_{D1}$, $T_{D2}$ and $T_{D3}$. The refresh signal Sr of the self refresh counter 340 has a refresh period Tr. Every the refresh period Tr within the standby period $T_1$, the enable signal IDDL is pulled from a low level (L) to a high level (H) periodically, such that the beginnings of the enable periods $T_{D1}$, $T_{D2}$ and $T_{D3}$ of the enable signal IDDL are determined according to the refresh signal Sr of the self refresh counter 340. In other words, within the standby period $T_1$, the enable signal IDDL is pulled up periodically from the low level (L) to the high level (H) in response to the operations of pulling up the refresh signal Sr from the low level (L) to the high level (H).

Moreover, the phase detector 350 generates the first control signal S1 based on the external clock signal XCLK. The control circuit 320 determines the lengths of the enable periods $T_{D1}$, $T_{D2}$ and $T_{D3}$ of the enable signal IDDL according to variations of the first control signal S1. In detail, each of the enable periods $T_{D1}$, $T_{D2}$ and $T_{D3}$ of the enable signal IDDL is ended when status of the first control signal S1 is changed twice. Since the feedback clock signal CLK would be very close to the external clock signal XCLK when the status of the first control signal S1 is changed frequently, the phase detector 350 finishes locking the feedback clock signal CLK to the external clock signal XCLK at the ends of the enable periods $T_{D1}$, $T_{D2}$ and $T_{D3}$. Accordingly, the lock state of the DLL 310 is maintained when the DRAM 300 is in the standby mode.

Figure 5:
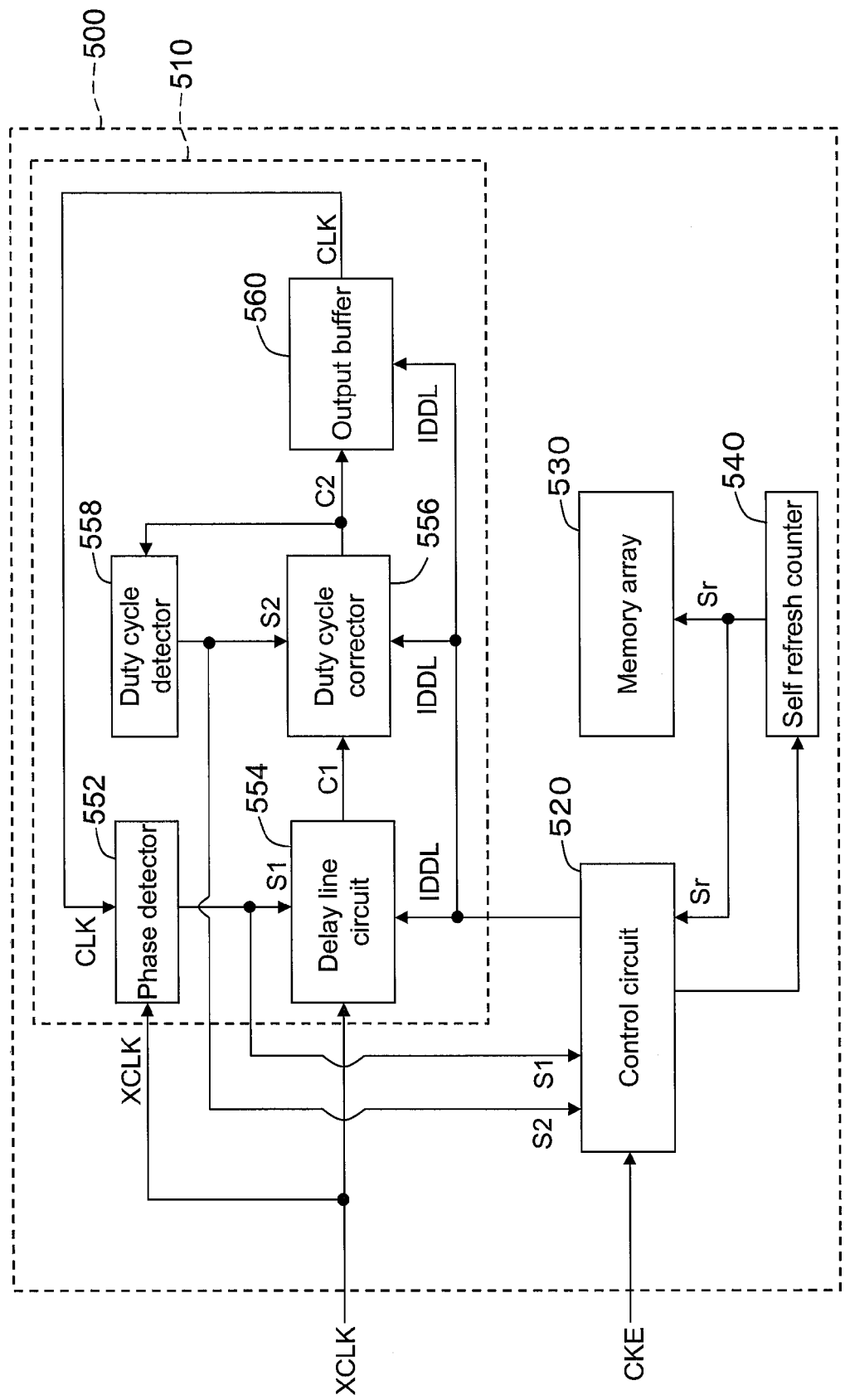
FIG. 5 is a functional block diagram of a DRAM of an embodiment of the present invention.

FIG. 5 is a functional block diagram of a dynamic random access memory (DRAM) 500 of an embodiment of the present invention. The DRAM 500 has a delay locked loop (DLL) 510, a control circuit 520, a memory array 530, and a self refresh counter 540. The DLL 510 receives an external clock signal XCLK. The control circuit 520 receives a clock enable signal CKE, a first control signal S1, a second control signal S2 and a refresh signal Sr to control the operations of the DRAM 500. The memory array 530 has a plurality of memory cells (not shown) for storing data. The self refresh counter 540 is used to refresh data stored in the memory array 530 of the DRAM 500, and the refresh signal Sr is used to trigger the DRAM 500 to refresh the stored data of the memory array 530.

The DLL 510 is used to align and lock the internal clock signal CLK to the external clock signal XCLK. The DLL 510 has a phase detector 552, a delay line circuit 554, a duty cycle corrector 556, a duty cycle detector 558 and an output buffer 560. The external clock signal XCLK is provided to the phase detector 552, and the phase detector 552 compares the external clock signal XCLK with the internal clock signal CLK, which is feedback from the output buffer 560. The phase detector 552 generates the first control signal S1 according to the result of the comparison of the external clock signal XCLK and the feedback clock signal CLK. The delay line circuit 554 is coupled between the phase detector 552 and duty cycle corrector 556 to receive and delay the external clock signal XCLK according to the first control signal S1 to output a first delayed clock signal C1. Accordingly, a delay of the delay line circuit 360 of the DLL 310 is adjusted based on the first control signal S1. The duty cycle corrector 556 adjusts the duty cycle of the first delayed clock signal C1 according to a second control signal S2 to output a second delayed clock signal C2. The duty cycle detector 558 detects the duty cycle of the second delayed clock signal C2 to generate the second control signal S2. The duty cycle corrector 556 adjusts the duty cycle of the second delayed clock signal C2 according to the second control signal S2. Moreover, the control circuit 520 detects the variations of the first control signal S1 or the variations of the second control signal S2 to determine the length of the enable period of the enable signal IDDL. Accordingly, the length of the enable period could be adjusted dynamically.

Figure 6:
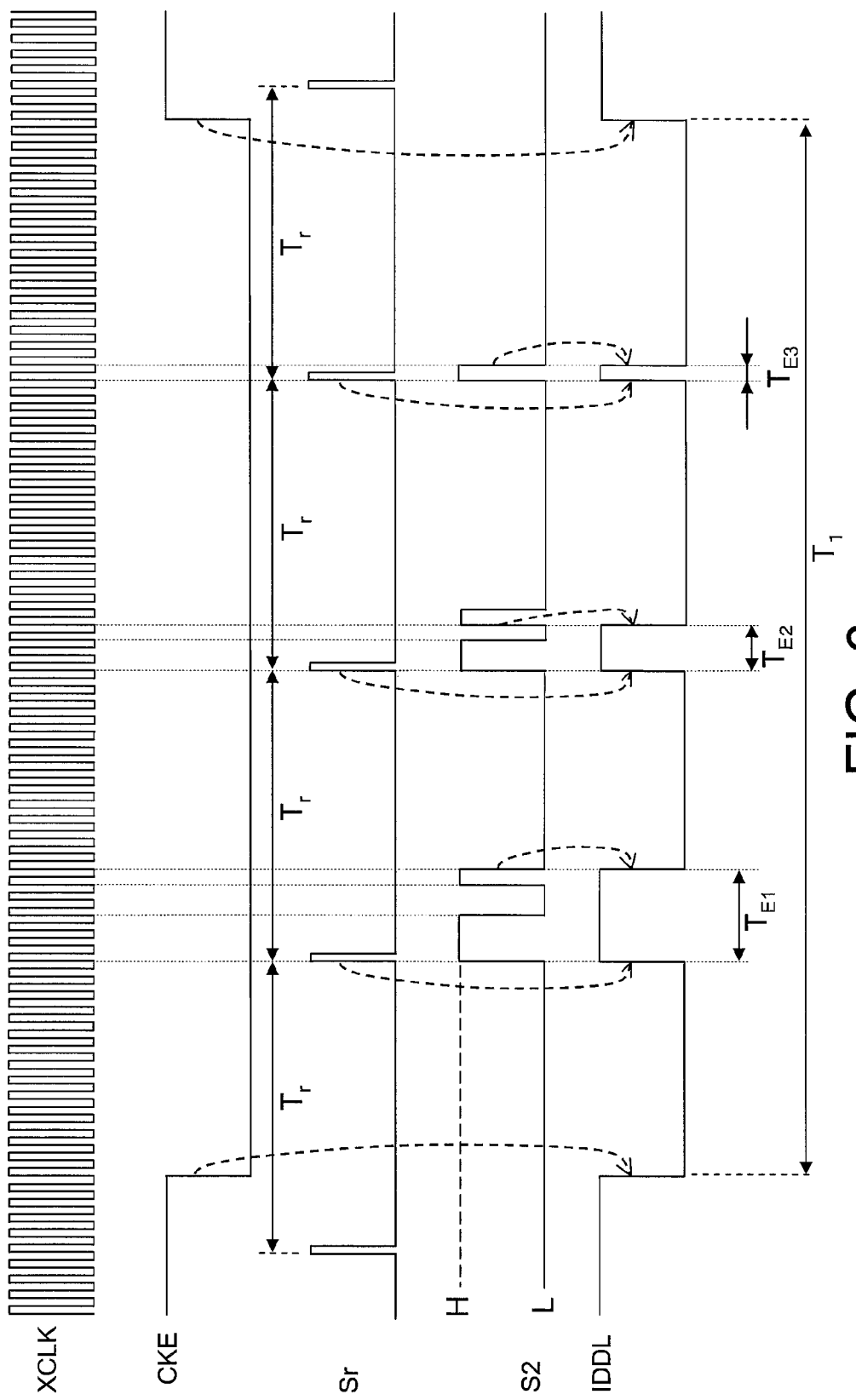
FIG. 6 is a timing diagram of signals of the DRAM shown in FIG. 5 according to an embodiment of the present invention.

FIG. 6 is a timing diagram of signals of the DRAM 500 according to an embodiment of the present invention. Referring to FIGS. 5 and 6, when the voltage level of the clock enable signal CKE is low, the DRAM 500 is in the standby mode (e.g. the IDD2P mode) to reduce the power consumption of the DRAM 500 within a standby period $T_1$. When the DRAM 500 is in the standby mode, the delay line circuit 554, the duty cycle corrector 556 and the output buffer 560 are active only during the enable periods $T_{E1}$, $T_{E2}$ and $T_{E3}$. The refresh signal Sr of the self refresh counter 540 has a refresh period Tr. Every the refresh period Tr within the standby period $T_1$, the enable signal IDDL is pulled from the low level (L) to the high level (H) periodically, such that the beginnings of the enable periods $T_{E1}$, $T_{E2}$ and $T_{E3}$ of the enable signal IDDL are determined according to the refresh signal Sr of the self refresh counter 540. In other words, within the standby period $T_1$, the enable signal IDDL is pulled up periodically from the low level (L) to the high level (H) in response to the operations of pulling up the refresh signal Sr from the low level (L) to the high level (H).

In the embodiment, the duty cycle detector 558 detects the duty cycle of the second delayed clock signal C2 to generate the second control signal S2. The second control signal S2 is transmitted to the control circuit 520. The control circuit 520 detects the variations of the second control signal S2 and determines the lengths of the enable periods $T_{E1}$, $T_{E2}$ and $T_{E3}$ of the enable signal IDDL based on the variations of the second control signal S2. In detail, the duty cycle detector 558 generates the second control signal S2 based on the external clock signal XCLK. Each of the enable periods $T_{E1}$, $T_{E2}$ and $T_{E3}$ of the enable signal IDDL is ended when status of the second control signal S2 is changed twice. Since the feedback clock signal CLK would be very close to the external clock signal XCLK when the status of the second control signal S2 is changed frequently, the phase detector 552 finishes locking the feedback clock signal CLK to the external clock signal XCLK at the ends of the enable periods $T_{E1}$, $T_{E2}$ and $T_{E3}$. Accordingly, the lock state of the DLL 510 is maintained when the DRAM 500 is in the standby mode.

Figure 7:
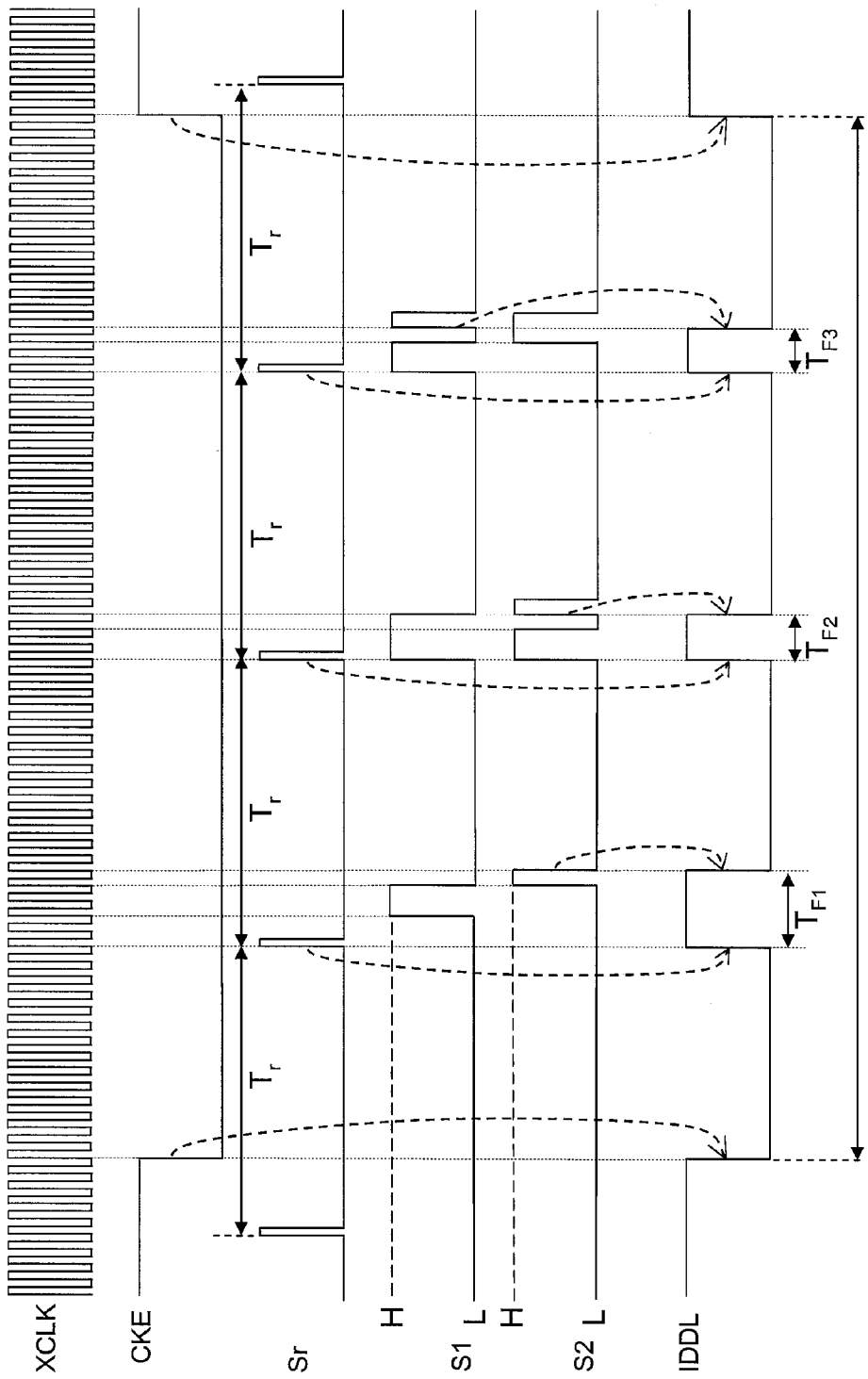
FIG. 7 is a timing diagram of signals of the DRAM shown in FIG. 5 according to another embodiment of the present invention.

In an embodiment of the present invention, the control circuit 520 determines the lengths of the enable periods of the enable signal IDDL according to the variations of the first control signal S1 or the variations of the second control signal S2. FIG. 7 is a timing diagram of signals of the DRAM 500 according to an embodiment of the present invention. Referring to FIGS. 5 and 7, when the voltage level of the clock enable signal CKE is low, the DRAM 500 is in the standby mode (e.g. the IDD2P mode) to reduce the power consumption of the DRAM 500 within the standby period $T_1$. When the DRAM 500 is in the standby mode, the delay line circuit 554, the duty cycle corrector 556 and the output buffer 560 are active only during the enable periods $T_{F1}$, $T_{F2}$ and $T_{F3}$. The refresh signal Sr of the self refresh counter 540 has a refresh period Tr. Every the refresh period Tr within the standby period $T_1$, the enable signal IDDL is pulled from the low level (L) to the high level (H) periodically, such that the beginnings of the enable periods $T_{F1}$, $T_{F2}$ and $T_{F3}$ of the enable signal IDDL are determined according to the refresh signal Sr of the self refresh counter 540. In other words, within the standby period $T_1$, the enable signal IDDL is pulled up periodically from the low level (L) to the high level (H) in response to the operations of pulling up the refresh signal Sr from the low level (L) to the high level (H).

In the embodiment, the phase detector 552 generates the first control signal S1 according to the result of the comparison of the external clock signal XCLK and the feedback clock signal CLK, and the duty cycle detector 558 detects the duty cycle of the second delayed clock signal C2 to generate the second control signal S2. The first control signal and the second control signal S2 are transmitted to the control circuit 520. The control circuit 520 detects the variations of the first control signal S1 and the variations of the second control signal S2 and determines the lengths of the enable periods $T_{F1}$, $T_{F2}$ and $T_{F3}$ of the enable signal IDDL based on the variations of the first control signal S1 or the variations of the second control signal S2. Each of the enable periods $T_{F1}$, $T_{F2}$ and $T_{F3}$ of the enable signal IDDL is ended when the status of the first control signal S1 or the second control signal S2 is changed twice. Since the feedback clock signal CLK would be very close to the external clock signal XCLK when the status of the first control signal S1 or the second control signal S2 is changed frequently, the phase detector 552 finishes locking the feedback clock signal CLK to the external clock signal XCLK at the ends of the enable periods $T_{F1}$, $T_{F2}$ and $T_{F3}$. Accordingly, the lock state of the DLL 510 is maintained when the DRAM 500 is in the standby mode.

In summary, the lengths of the enable periods of the enable signal are determined by detecting variations of the first control signal or the second control signal. Therefore, the enable periods of the DLL could be adjusted dynamically when the DRAM is in the standby mode. Moreover, the beginnings of the enable periods of the enable signal IDDL are determined according to the refresh signal of the self refresh counter of the DRAM, no extra clock counter for counting clocks of the external clock signal is required, such that the consumed power of the DRAM would not increased excessively to violate the specification of the standby mode (e.g. the IDD2P mode).

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for controlling operations of a delay locked loop (DLL) of a dynamic random access memory (DRAM), the method comprising steps of:
    providing an external clock signal to a phase detector of the DLL;
    comparing the external clock signal with a feedback clock signal by using the phase detector, wherein the feedback clock signal is received from an output buffer of the DLL;
    generating a first control signal according to a result of the comparison of the external clock signal and the feedback clock signal;
    adjusting a delay of a delay line circuit of the DLL based on the first control signal, wherein the delay line circuit is coupled between the phase detector and the output buffer to receive and delay the external clock signal; and
    detecting variations of the first control signal to determine a length of an enable period of an enable signal, wherein the delay line circuit and the output buffer are active only during the enable period when the DRAM is in a standby mode.

2. The method as claimed in claim 1, wherein the phase detector generates the first control signal based on the external clock signal, and the method further comprises a step of:
    ending the enable period of the enable signal when status of the first control signal is changed twice.

3. The method as claimed in claim 1 further comprising a step of:
    determining a beginning of the enable period of the enable signal according to a refresh signal of a self refresh counter of the DRAM,
    wherein the self refresh counter is used to refresh data stored in the DRAM, and the refresh signal is used to trigger the DRAM to refresh the data.

4. The method as claimed in claim 1 further comprising steps of:
    adjusting a duty cycle of a first delayed clock signal outputted by the delay line circuit according to a second control signal to output a second delayed clock signal;
    detecting the duty cycle of the second delayed clock signal to generate the second control signal; and
    detecting variations of the second control signal;
    wherein the length of the enable period of the enable signal is determined based to on the variations of the first control signal and the variations of the second control signal.

5. The method as claimed in claim 4, wherein the first control signal and the second control signal are generated based on the external clock signal, and the method further comprises a step of:
    ending the enable period of the enable signal when status of the first control signal or the second control signal is changed twice.

6. A method for controlling operations of a delay locked loop (DLL) of a dynamic random access memory (DRAM), the method comprising steps of:
    providing an external clock signal to a phase detector of the DLL;
    comparing the external clock signal with a feedback clock signal by using the phase detector, wherein the feedback clock signal is received from an output buffer of the DLL;
    generating a first control signal according to a result of the comparison of the external clock signal and the feedback clock signal;
    adjusting a delay of a delay line circuit of the DLL based on the first control signal, wherein the delay line circuit is coupled between the phase detector and the output buffer to receive and delay the external clock signal;
    adjusting a duty cycle of a first delayed clock signal outputted by the delay line circuit according to a second control signal to output a second delayed clock signal by using a duty cycle corrector;
    detecting the duty cycle of the second delayed clock signal to generate the second control signal; and
    detecting variations of the first control signal or variations of the second control signal to determine a length of an enable period of an enable signal, wherein the delay line circuit, the duty cycle corrector and the output buffer are active only during the enable period when the DRAM is in a standby mode.

7. The method as claimed in claim 6, wherein the first control signal and the second control signal are generated based on the external clock signal, and the method further comprises a step of:
    ending the enable period of the enable signal when status of the first control signal or the second control signal is changed twice.

8. The method as claimed in claim 6 further comprising a step of:
    determining a beginning of the enable period of the enable signal according to a refresh signal of a self refresh counter of the DRAM,
    wherein the self refresh counter is used to refresh data stored in the DRAM, and the refresh signal is used to trigger the DRAM to refresh the data.

* * * * *